United States Patent
Matsumoto et al.

(10) Patent No.: US 10,587,364 B2
(45) Date of Patent: Mar. 10, 2020

(54) WIRELESS COMMUNICATION SYSTEM, WIRELESS COMMUNICATION DEVICE AND WIRELESS COMMUNICATION METHOD

(71) Applicant: Hitachi Kokusai Electric Inc., Minato-ku, Tokyo (JP)

(72) Inventors: Tadashi Matsumoto, Nomi (JP); Ade Irawan, Nomi (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 16/313,958

(22) PCT Filed: Jul. 5, 2016

(86) PCT No.: PCT/JP2016/069889
§ 371 (c)(1),
(2) Date: Dec. 28, 2018

(87) PCT Pub. No.: WO2018/008084
PCT Pub. Date: Jan. 11, 2018

(65) Prior Publication Data
US 2019/0165886 A1    May 30, 2019

(51) Int. Cl.
*H04L 1/00* (2006.01)
*H03M 13/45* (2006.01)
(Continued)

(52) U.S. Cl.
CPC .......... *H04L 1/0054* (2013.01); *H03M 13/27* (2013.01); *H03M 13/3769* (2013.01);
(Continued)

(58) Field of Classification Search
CPC ....... H04L 1/0054; H04L 1/18; H04L 5/0055; H03M 13/45; H03M 13/47; H04W 28/04
See application file for complete search history.

(56) References Cited

U.S. PATENT DOCUMENTS

| 8,743,780 B2 * | 6/2014 | Sangiamwong .... H04W 72/005 370/328 |
| 2009/0168711 A1 * | 7/2009 | Fukuoka ............... H04L 1/0003 370/329 |

(Continued)

OTHER PUBLICATIONS

Irawan, Ade, and Matsumoto, Tadashi. [Invited Talk] Outage Probability Analyses of HARQ with M-in-1 XORed Packet Using Theorem of Source Coding with a Helper, IEICE Technical Report (Jan. 2016), IT2015-94,SIP2015-108, RCS2015-326, Institute of Electronics, Information and Communication Engineers.

*Primary Examiner* — Janice N Tieu
(74) *Attorney, Agent, or Firm* — Greer Burns & Crain Ltd.

(57) ABSTRACT

A wireless communication system and device improve throughput in a propagation path environment where retransmission is repeated. In a transmission-side wireless communication device, transmission signal storage memories hold bit sequences related to two packet signals for which NACK has been returned, a helper packet generation unit operates the exclusive OR of bit sequences related to two or more of a predetermined number of packet signals held in the transmission signal storage memories, and a coding unit to a transmitting and receiving antenna transmits an auxiliary packet generated by coding a bit sequence of a helper packet that is a result of the exclusive OR operation when the number of packet signals for which NACK has been returned reaches the predetermined number.

5 Claims, 18 Drawing Sheets

(51) Int. Cl.
*H04L 1/18* (2006.01)
*H04W 28/04* (2009.01)
*H03M 13/37* (2006.01)
*H03M 13/00* (2006.01)
*H03M 13/27* (2006.01)
*H03M 13/47* (2006.01)
*H04L 5/00* (2006.01)

(52) U.S. Cl.
CPC ........... *H03M 13/45* (2013.01); *H03M 13/47* (2013.01); *H03M 13/6306* (2013.01); *H04L 1/18* (2013.01); *H04L 1/1819* (2013.01); *H04L 5/0055* (2013.01); *H04W 28/04* (2013.01)

(56) References Cited

U.S. PATENT DOCUMENTS

| | | | | |
|---|---|---|---|---|
| 2011/0041023 | A1* | 2/2011 | Shimezawa | H04L 1/1819 714/748 |
| 2011/0044409 | A1* | 2/2011 | Yoshimoto | H04J 11/004 375/340 |
| 2013/0148563 | A1* | 6/2013 | Brueck | H04W 4/06 370/312 |

* cited by examiner conventional system system according to present invention conventional system system according to present invention conventional system system according to
present invention

WIRELESS COMMUNICATION SYSTEM, WIRELESS COMMUNICATION DEVICE AND WIRELESS COMMUNICATION METHOD

TECHNICAL FIELD

The present invention relates to a Hybrid Automatic Repeat reQuest (hereinafter, referred to as HARQ), which is a retransmission/reception technology for packet signals mainly in wireless communication.

BACKGROUND ART

As a general practice for communication with high reliability, the reception side sends back to the transmission side a message for notifying ACK (ACKnowledgment) to indicate that a packet signal has been received normally, or NACK (Negative-ACK) to indicate that a packet signal could not be received normally, whereas the transmission side makes an Automatic Repeat reQuest (hereinafter, referred to as ARQ) where retransmission is repeated until the reception side receives it correctly, or the number of times of transmission reaches a predetermined number.

Another HARQ is also used where the interleave pattern or the puncture pattern is updated when the packet signal is retransmitted so that the reception side performs processes by using the signal that could not be received correctly at the previous time and the retransmitted signal, and thus, the reception performance is improved though the cost for mounting the device increases.

PRIOR ART DOCUMENT

Non-Patent Document

Non-Patent Document 1: "Outage Probability Analyses of HARQ with M-in-1 XORed Packet Using Theorem of Source Coding with a Helper", IEICE Technical Report, vol. 115, no. 396, RCS2015-326, pp. 253-258, January 2016

SUMMARY OF INVENTION

Technical Problem

In an environment where retransmission is repeated through a propagation path, the total number of packets transmitted through an HARQ becomes 2M when the number of transmitted packets is M, and thus, the throughput lowers to 1/2.

The present invention is provided in view of the conventional situation as described above, and an object thereof is to provide a technology that makes it possible to improve the throughput in an environment where retransmission is repeated through a propagation path.

Solution to Problem

In the wireless communication system according to the present invention, the wireless communication device on a transmission side transmits a packet signal that has been generated by encoding a bit sequence to be transmitted, and the wireless communication device on a reception side sends back ACK to indicate that the packet signal has been received normally or NACK to indicate that the packet signal could not be received normally.

The wireless communication device on the transmission side is provided with: a transmitted packet information storage unit that stores the bit sequence concerning the packet signal for which NACK has been sent back; an operation unit that operates an exclusive-or operation on bit sequences concerning a predetermined number, which is two or greater, of packet signals that are stored in the transmitted packet information storage unit; and a transmission unit that transmits an auxiliary packet signal that has been generated by encoding a bit sequence resulting from the operation by the operation unit in a case where a number of packet signals for which NACK has been sent back reaches the predetermined number.

The wireless communication device on the reception side is provided with: a likelihood calculation unit that calculates a likelihood information of a received packet signal; a received packet information storage unit that stores the likelihood information of the received packet signal for which NACK has been sent back; and a decoding unit that decodes the auxiliary packet signal and the predetermined number of packet signals for which NACK has been sent back on a basis of the likelihood information of the auxiliary packet signal and the likelihood information of the predetermined number of packet signals stored in the received packet information storage unit in a case where the auxiliary packet signal has been received.

The decoding unit carries out a decoding process, which corresponds to the encoding, on the respective pieces of the likelihood information of the auxiliary packet signal and the predetermined number of packet signals for which NACK has been sent back, updates the respective pieces of the likelihood information after the decoding process on a basis of a mutual information of the corresponding packet signals, and carries out an operation, which corresponds to exclusive-or by the operation unit, on the respective pieces of the likelihood information after being updated so that the respective pieces of likelihood information resulting from the operation are reflected in the decoding process for the corresponding packet signals.

Here, the above-described wireless communication system may have such a configuration that the wireless communication device on the transmission side transmits a plurality of packet signals that have been generated by encoding a plurality of bit sequences that correlate with each other, the decoding unit has three or more decoders for carrying out the decoding process, which corresponds to the encoding, on each piece of the likelihood information on the auxiliary packet signal and the predetermined number of packet signals for which NACK has been sent back, and the likelihood information after the decoding process by one decoder from among the decoders is updated on a basis of the likelihood information after the decoding process by another decoder so that the likelihood information after being updated is reflected in the decoding process by another decoder.

In addition, the system may have such a configuration that the decoding unit has a structure where the respective decoders are connected in an annular form or a structure where the respective decoders are connected through all combination so that the likelihood information after the decoding process by one decoder from among the decoders that are connected to each other in the structure is updated on a basis of the likelihood information after the decoding process by another decoder, and thus, the likelihood information after being updated is reflected in the decoding process by another decoder.

The present invention can be grasped as a wireless communication device on the transmission side or on the reception side that forms a wireless communication system as described above. Alternatively, the invention can be grasped as a wireless communication method that is implemented in a wireless communication system as described above, or as a wireless communication method that is implemented in the wireless communication device on the transmission side or on the reception side.

Advantageous Effects of Invention

The present invention makes it possible to improve the throughput in an environment where retransmission is repeated through a propagation path.

DESCRIPTION OF EMBODIMENTS

In the following, the embodiments of the present invention are described in reference to the drawings. The respective embodiments in the following are merely illustrative and do not restrict the present invention.

First Embodiment

The wireless communication system according to the present invention has a wireless communication device on the transmission side of a packet signal and a wireless communication device on the reception side of the packet signal.

Figure 1:
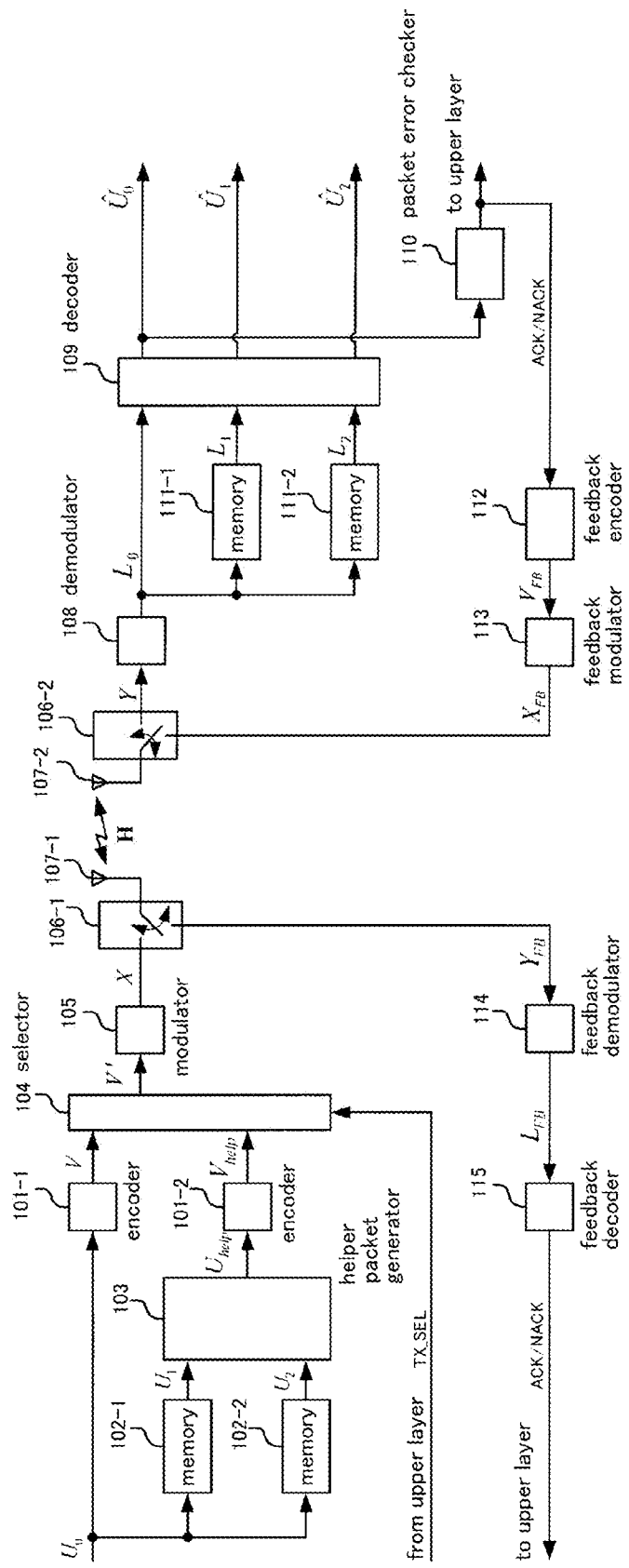
FIG. 1 is a functional block diagram showing the configuration of the wireless communication system according to the first embodiment of the present invention.

FIG. 1 is a functional block diagram showing the wireless communication system according to the first embodiment of the present invention. The first embodiment has a configuration where one helper packet is provided for two packets to be retransmitted (m=2). In the first embodiment, a helper packet is transmitted when the number of packets for which NACK has been returned reaches two.

The wireless communication device on the transmission side in the first embodiment is provided with: encoding units 101-1 and 101-2; transmitted signal storage memories 102-1 through 102-m (=2); a helper packet generating unit 103; a transmitted signal selector 104; a modulator 105; a transmission/reception signal switcher 106-1; a transmission/reception antenna 107-1; a feedback demodulator 114; and a feedback decoder 115. The wireless communication device on the reception side in the first embodiment is provided with: a transmission/reception antenna 107-2; a transmission/reception signal switcher 106-2; a demodulator 108; a decoding unit 109; a packet error checker 110; demodulated signal storage memories 111-1 through 111-m (=2); a feedback encoder 112; and a feedback modulator 113. For the purpose of simplicity, the present embodiment is described using the "Stop & Wait system" as an example of the ARQ system.

The encoding units 101-1 and 101-2 encode the inputted bit sequence U and output the resulting encoded bit sequence V. Concretely, the first encoding unit 101-1 encodes the bit sequence $U_0$ of the main line transmission packet to be transmitted at the present time and outputs the encoded bit sequence V. The second encoding unit 101-2 encodes the bit sequence $U_{help}$ of the helper packet and outputs the encoded bit sequence $V_{help}$. As described below, the helper packet is generated on the basis of the bit sequence of m packet signals that had been transmitted before the present time and for which NACK has been returned. The encoding units 101-1 and 101-2 are described in detail in reference to FIG. 2.

Figure 2:
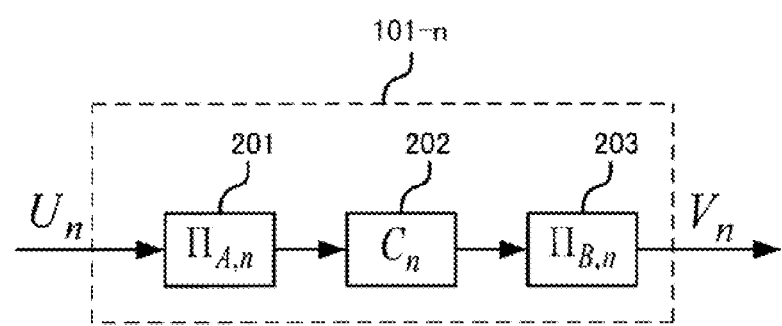
FIG. 2 is a functional block diagram showing the configuration of the helper packet generating unit in the first embodiment of the present invention.

FIG. 2 shows the configuration of encoding units 101-1 and 101-2 in the first embodiment of the present invention. In the following, the encoding units 101-1 and 101-2 are collectively denoted as encoding unit 101-n. The encoding unit 101-n is provided with an information bit region bit interleaver 201, an encoder 202 and an encoded bit region bit interleaver 203.

The information bit region bit interleaver 201 rearranges in a predetermined order the bit sequence $U_n$ that has been inputted into the encoding unit 101-n and outputs the results. The information bit region bit interleaver 201 is used for the exchange of bit likelihood information in the information bit region with the decoder of the helper packet within the below-described decoding unit 109. Here, the interleave pattern may be different for each encoding unit 101-n.

The encoder 202 carries out error correction encoding on the bit sequence after being rearranged by the information bit region bit interleaver 201 and outputs the results.

The encoded bit region bit interleaver 203 rearranges in a predetermined order the bit sequence after the error correction encoding and outputs the result as an encoded bit sequence $V_n$. The encoded bit region bit interleaver 203 is an interleaver that is closed within each packet, and provides a region for the encoded bit. Here, the interleave pattern may be different for each encoding unit 101-n.

The transmitted signal storage memories 102-1 through 102-m store the bit sequences $U_1$ through $U_m$ of m packet signals that have become NACK after having been transmitted before the present time in order to generate a helper packet.

The helper packet generating unit 103 uses the bit sequences $U_1$ through $U_m$ of the m packet signals stored in the transmitted signal storage memories 102-1 through 102-m so as to generate the bit sequence $U_{help}$ of a helper packet. The helper packet generating unit 103 is described in detail in reference to FIG. 3.

Figure 3:
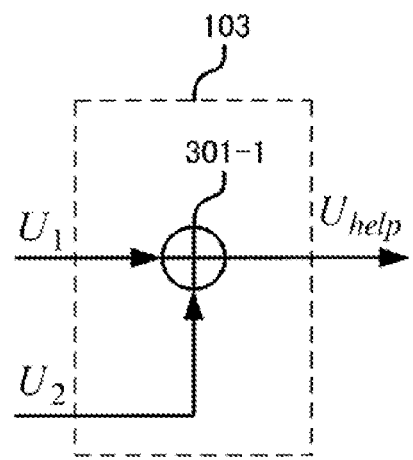
FIG. 3 is a functional block diagram showing the configuration of the encoding unit in the first embodiment of the present invention.

FIG. 3 shows the configuration of the helper packet generating unit 103. The helper packet generating unit 103 is provided with an exclusive-or operator 301-1.

The helper packet generating unit 103 allows the exclusive-or operator 301-1 to carry out an exclusive-or operation as shown in the following formula on each bit of the packet signals that are stored in the transmitted signal storage memories 102-1 through 102-m and for which NACK has been returned, and outputs the operation results as a bit series of the helper packet. In the first embodiment, the exclusive-or of the two packet signals for which NACK has been returned is the helper packet.

[Formula 1]

$$U_{help}=U_A \oplus U_B \quad (1)$$

$\oplus$ in the above formula denotes an exclusive-or operation. When the number of packets to be retransmitted is m=1, $U_{help}$ is $U_1$, and thus, it is obvious for it to be the same as the typical HARQ. When m≥2, the present invention provides its effects.

The transmitted signal selector 104 selects either the bit sequence V of the main line transmitted packet that is outputted from the encoding unit 101-1 or the bit sequence $V_{help}$ of the helper packet that is outputted from the encoding unit 101-2.

The bit sequence V' that had been selected by the transmitted signal selector 104 is inputted into the modulator 105, which then carries out a predetermined modulation processing on the bit sequence V' and outputs the signal X resulting from the modulation.

The transmission/reception switchers 106-1 and 106-2 switch the objects to be connected between the time of normal data transmission/reception and feedback data transmission/reception. Concretely, the transmission/reception switcher 106-1 connects the transmission/reception antenna 107-1 to the modulator 105 at the time of normal data transmission/reception, and connects the transmission/reception antenna 107-1 to the feedback demodulator 114 at the time of feedback data transmission/reception. The transmission/reception switcher 106-2 connects the transmission/reception antenna 107-2 to the demodulator 108 at the time of normal data transmission/reception, and connects the transmission/reception antenna 107-2 to the feedback modulator 113 at the time of feedback data transmission/reception.

The transmission/reception antennas 107-1 and 107-2 transmit or receive a signal to be communicated in a wireless manner. Concretely, the transmission/reception antennas 107-1 and 107-2 transmit or receive a main line transmitted packet signal or a helper packet signal at the time of normal data transmission/reception, and transmit or receive a feedback signal at the time of feedback data transmission/reception.

The demodulator 108 demodulates the signal Y that has been received by the transmission/reception antenna 107-2 and outputs the LLR (Log Likelihood Ratio) as the results of demodulation.

In the case where the packet signal of a helper packet is received, the decoding unit 109 uses the LLR sequence Lo of the packet signal (packet received at the present time) of the helper packet, and the LLR $L_1$ through $L_m$ of the m packet signals that had been received before the present time and for which NACK had been returned so as to carry out error correction decoding and outputs the bit sequences $U\hat{}_0$ through $U\hat{}_m$ resulting from the decoding.

Figure 4:
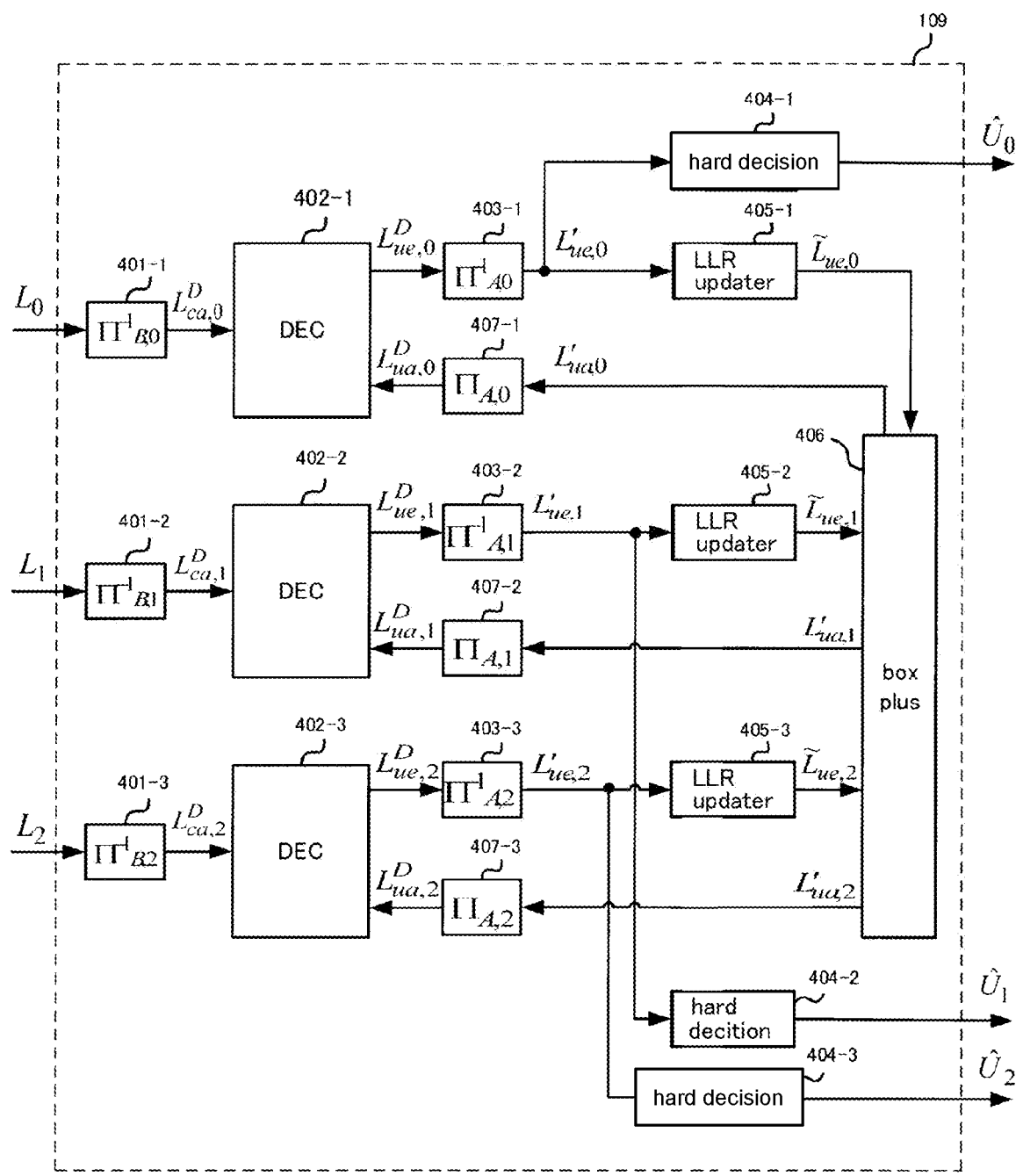
FIG. 4 is a functional block diagram showing the configuration of the decoding unit in the first embodiment of the present invention.

FIG. 4 shows the configuration of the decoding unit 109 in the first embodiment. The decoding unit 109 is provided with an encoded bit region LLR deinterleaver 401-i, an error correction decoder 402-i, an information bit region LLR deinterleaver 403-i, a hard decision operator 404-i, an LLR updater A 405-i, a boxplus 406 and an information bit region LLR interleaver 407-i. Here, i=0 through m (where m=2). In addition, i=0 corresponds to the packet signal of the helper packet received at the present time, and i=1 through m corresponds to the packet signal that had been received before the present time and for which NACK has been returned.

The encoded bit region LLR deinterleaver 401-i carries out on the inputted LLR sequence $L_1$ a process for returning the order of the LLR series that corresponds to the order rearranged by the encoded bit region bit interleaver 203 to its original order, and outputs the resulting LLR sequence $L^D_{ca, i}$.

The error correction decoder 402-i carries out error correction decoding on the LLR sequence $L^D_{ca, i}$ that has been outputted from the encoded bit region LLR deinterleaver 401-i, and outputs the resulting LLR sequence $L^D_{ue, i}$. In this error correction decoding, the LLR sequence $L^D_{ua, i}$ that is outputted from the below-described information bit region LLR interleaver 407-i is fed back.

The information bit region LLR deinterleaver 403-i carries out on the LLR sequence $L^D_{ue, i}$ resulting from the error correction decoding a process for returning the order of the LLR sequence that corresponds to the order rearranged by the information bit region bit interleaver 201 to its original order, and outputs the resulting LLR sequence $L'_{ue, i}$.

The hard decision operator 404-i hard decisions the LLR sequence $L'_{ue, i}$ that has been outputted from the information bit region LLR deinterleaver 403-i, and outputs the results of determination as the bit sequence $U\hat{}_i$ resulting from the decoding. In the hard decision, the code bit of the LLR may be sampled, for example.

The LLR updating unit A 405-i uses the LLR sequence $L'_{ue, i}$ that has been outputted from the information bit region LLR deinterleaver 403-i so as to update the LLR in accordance with the following formula, and outputs the resulting LLR sequence $L\tilde{}_{ue, i}$.

[Formula 2]

$$L_{out} = \ln\frac{(1-\hat{p}_e)\cdot\exp(L_{in})+\hat{p}_e}{(1-\hat{p}_e)+\exp(L_{in})\cdot\hat{p}_e} \quad (2)$$

Here, $L_{in}=L'_{ue,i}$, and $L_{out}=\tilde{L}_{ue,i}$, In addition, $\hat{p}_e$ is an estimated value of the bit error ratio and is calculated in the following formula using the standard deviation $\sigma_D$ and the error co-function erfc (•).

[Formula 3]

$$\hat{p}_e = \frac{1}{2}\text{erfc}\left(\frac{\sigma_D}{2\sqrt{2}}\right) \quad (3)$$

Here, the standard deviation $\sigma_D$ is calculated in the following formula using the inverse function $J^{-1}(\bullet)$ of J-function and the mutual information $I^D_i$.

[Formula 4]

$$\sigma_D = J^{-1}(I^D_i) \quad (4)$$

The mutual information $I^D_i$ is calculated in the following formula, for example, using the inputted LLR sequence.

[Formula 5]

$$I^D_i = E\left[1+\frac{e^{L^D_{e,i}}}{1+e^{L^D_{e,i}}}\log\left(\frac{e^{L^D_{e,i}}}{1+e^{L^D_{e,i}}}\right)+\frac{1}{1+e^{L^D_{e,i}}}\log\left(\frac{1}{1+e^{L^D_{e,i}}}\right)\right] \quad (5)$$

The boxplus 406 carries out a boxplus operation on the m+1 LLR sequences $\tilde{L}_{ue,i}$ that have been outputted respectively from the LLR updating units A 405-i, and outputs the resulting m+1 LLR sequences $L'_{ua,i}$. In the boxplus operation, LLR is calculated in the following formula. The boxplus operation corresponds to the exclusive-or operation in the LLR region.

[Formula 6]

$$\tilde{L}_l = 2\cdot\tanh^{-1}\left(\prod_{k=1|k\neq l}^{K}\tanh((L_k/2))\right) \quad (6)$$

The information bit region LLR interleaver 407-i carries out a process for realigning the LLR sequence $L'_{ua,i}$ that has been outputted from the boxplus 406 in the same order as the order that has been realigned in the information bit region bit interleaver 201, and outputs the resulting LLR sequence $L^D_{ua,i}$. The LLR sequence $L^D_{ua,i}$ that has been outputted from the information bit region LLR interleaver 407-i is fed back to the error correction decoder 402-i.

In the above-described decoding unit in the first embodiment, the decoding results of the two packet signals for which NACK has been returned and the decoding results of the packet signal of the helper packet are exchanged with each other so as to enhance the error correction performance.

A packet error checker 110 carries out error checking such as CRC (Cyclic Redundancy Check) on the bit sequence $\hat{U}_0$, which is the decoding result of the packet signal that has been received at the present time, and outputs a feedback signal that includes ACK in the case where there is no error, or NACK in the case where an error has been detected.

Demodulated signal storage memories 111-1 through 111-m store the LLR sequences $L_1$ through $L_m$, which are the demodulation results of the m packet signals that had been received before the present time and for which NACK has been detected.

A feedback encoder 112 carries out error correction encoding on a feedback signal that includes ACK/NACK, and outputs the resulting feedback signal $V_{FB}$.

A feedback modulator 113 carries out a modulation process on the feedback signal $V_{FB}$ that includes ACK/NACK that has been error correction encoded, and outputs the signal $X_{FB}$ which is the modulation result.

A feedback demodulator 114 carries out a demodulation process on the feedback signal $V_{FB}$ that includes fed back ACK/NACK and that has been transmitted from the second wireless communication device and received by the first wireless communication device, and outputs the demodulation results $L_{FB}$.

A feedback decoder 115 carries out an error correction process on the demodulation results $L_{FB}$ of the feedback signal that includes the fed back ACK/NACK.

As described above in the first embodiment, one helper packet is transmitted to two packets for which NACK has been returned, and as a result, the throughput is increased in the packets for which NACK has been returned as compared to the conventional system.

Figure 5A:
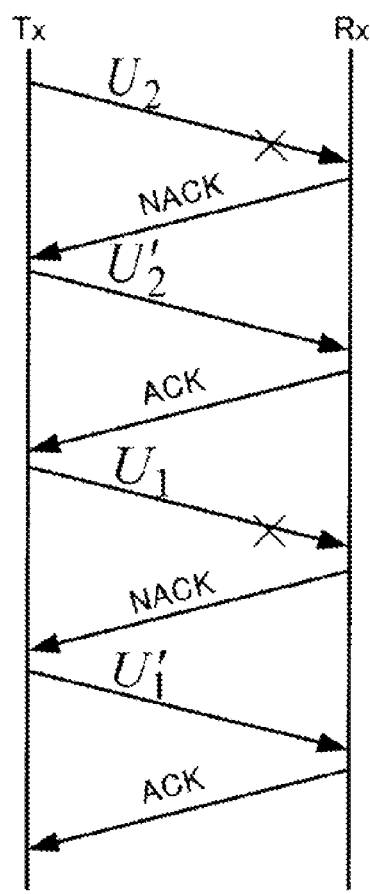
FIG. 5A and FIG. 5B are a diagram showing the comparison of the communication method between the type in the first embodiment of the present invention and the conventional type.
Figure 5B:
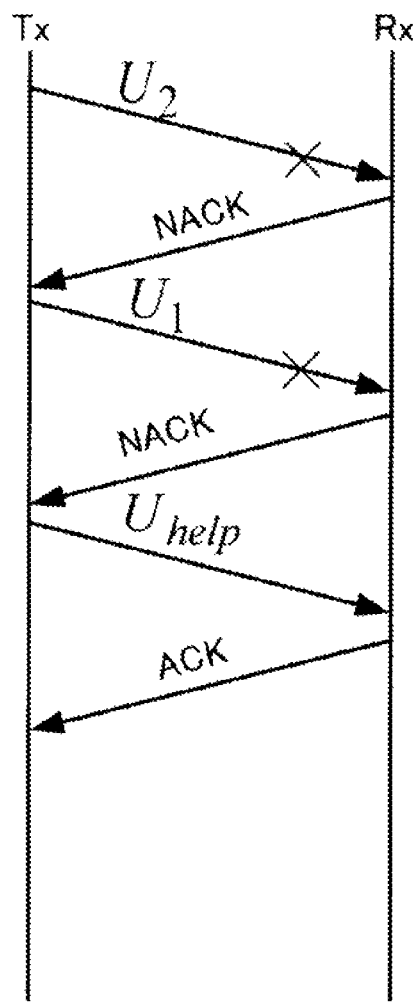

FIG. 5A and FIG. 5B show the comparison in the communication method between the system in the first embodiment and the conventional system. As shown in FIG. 5A and FIG. 5B, retransmission packets $U'_1$ and $U'_2$ are transmitted for the respective transmission packets $U_1$ and $U_2$ that have become NACK in the conventional communication system, and therefore, packet transmission takes place four times. In contrast, in the communication system in the first embodiment, one helper packet $U_{help}$ can be transmitted in response to the two transmission packets $U_1$ and $U_2$, and therefore, packet transmission may be carried out only three times. Accordingly, in the communication system in the first embodiment, it is possible to increase the throughput by 4/3 times as compared to the conventional communication system. In addition, the present embodiment is described using the "Stop & Wait system" having the simplest operation as an example of an ARQ system for the purpose of simplicity; however, it is clear that the present invention can be applied to other ARQ systems.

Second Embodiment

Figure 6:
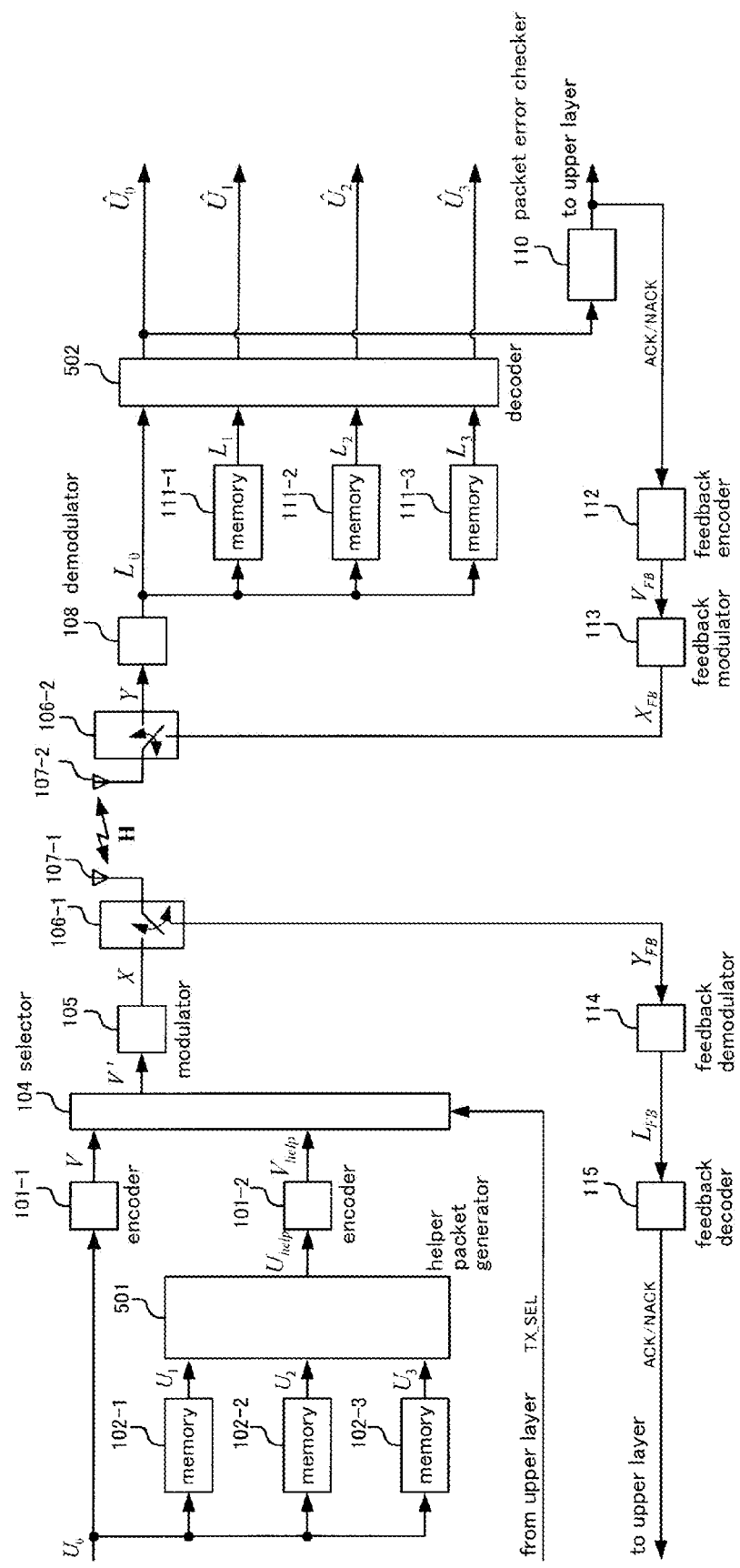
FIG. 6 is a functional block diagram showing the configuration of the wireless communication system according to the second embodiment of the present invention.

FIG. 6 shows the functional block diagram of the second embodiment of the present invention. The second embodiment has a configuration where there is one helper packet for three packets that are to be retransmitted. In the second embodiment, a helper packet is transmitted when the number of packets for which NACK has been determined becomes three. Here, the present embodiment is described using the "Stop & Wait system" as an example of an ARQ system for the purpose of simplicity.

The wireless communication device on the transmission side in the second embodiment is provided with: encoding units 101-1 and 101-2; transmitted signal storage memories 102-1 through 102-m (=3); a helper packet generating unit 501; a transmitted signal selector 104; a modulator 105; a transmission/reception signal switcher 106-1; a transmission/reception antenna 107-1; a feedback demodulator 114; and a feedback decoder 115. The wireless communication device on the reception side in the second embodiment is provided with: a transmission/reception antenna 107-2; a transmission/reception signal switcher 106-2; a demodulator 108; a decoding unit 502; a packet error checker 110; demodulated signal storage memories 111-1 through 111-m (=3); a feedback encoder 112; and a feedback modulator 113.

The encoding units 101-1 and 101-2, the transmitted signal storage memories 102 through 102-m, the transmitted signal selector 104, the modulator 105, the transmission/reception signal switchers 106-1 and 106-2, the transmission/reception antennas 107-1 and 107-2, the demodulator 108, the packet error checker 110, the demodulated signal storage memories 111-1 through 111-m, the feedback encoder 112, the feedback modulator 113, the feedback demodulator 114 and the feedback decoder 115 are the same as those in the first embodiment, and therefore, the descriptions thereof are not repeated.

Figure 7:
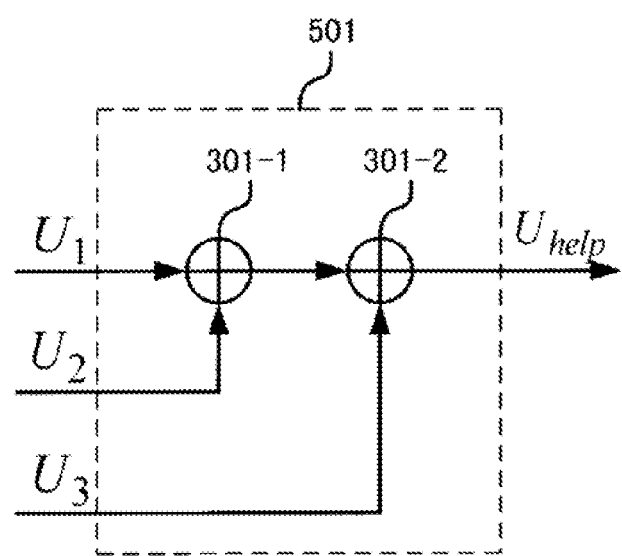
FIG. 7 is a functional block diagram showing the configuration of the helper packet generating unit in the second embodiment of the present invention.

FIG. 7 shows the configuration of the helper packet generating unit 501 in the second embodiment. In the second embodiment, the exclusive-or of the bit sequences $U_1$, $U_2$ and $U_3$ of the three packet signals of which NACK has been determined is operated using the two exclusive-or operators 301-1 and 301-2, and the results are outputted as a helper packet $V_{help}$.

Figure 8:
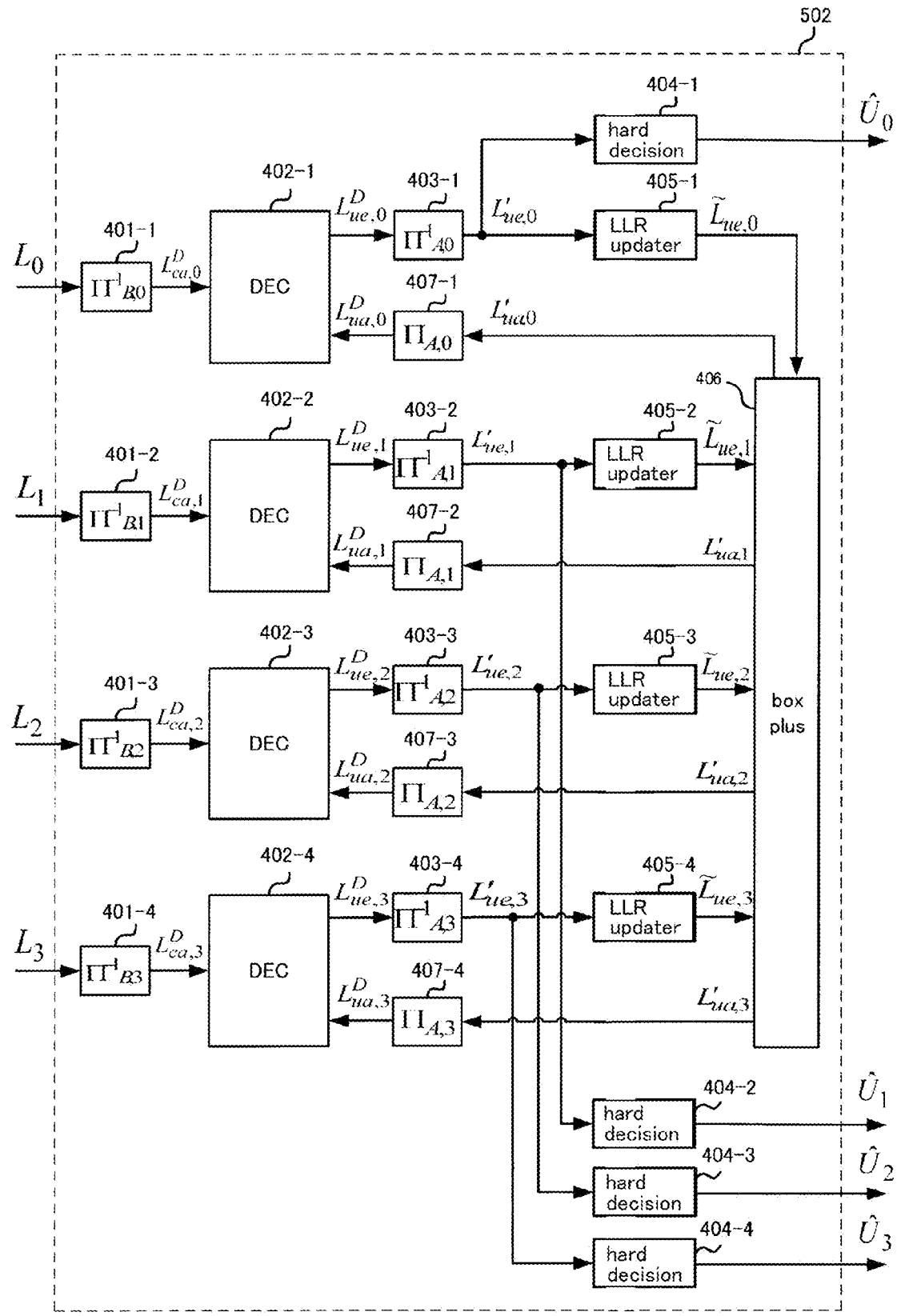
FIG. 8 is a functional block diagram showing the configuration of the decoding unit in the second embodiment of the present invention.

FIG. 8 shows the configuration of the decoding unit 502 in the second embodiment. The decoding unit 502 is provided with: an encoded bit region LLR deinterleaver 401-i; an error correction decoder 402-i; an information bit region LLR deinterleaver 403-i; a hard decision operator 404-i; an LLR updater A 405-i; a boxplus 406; and an information bit region LLR interleaver 407-i. Here, i=0 through m (here, m=3). The respective components are the same as those in the first embodiment, and therefore, the descriptions thereof are not repeated.

In the decoding unit 502 in the second embodiment, the decoding results of the three packet signals for which NACK has been returned and the decoding results of the packet signal of the helper packet are exchanged with each other so as to enhance the error correction performance.

As described above in the second embodiment, one helper packet is transmitted in response to the three packets for which NACK has been returned, and as a result, the throughput increases in the packets for which NACK has been returned as compared to the conventional system.

Figure 9A:
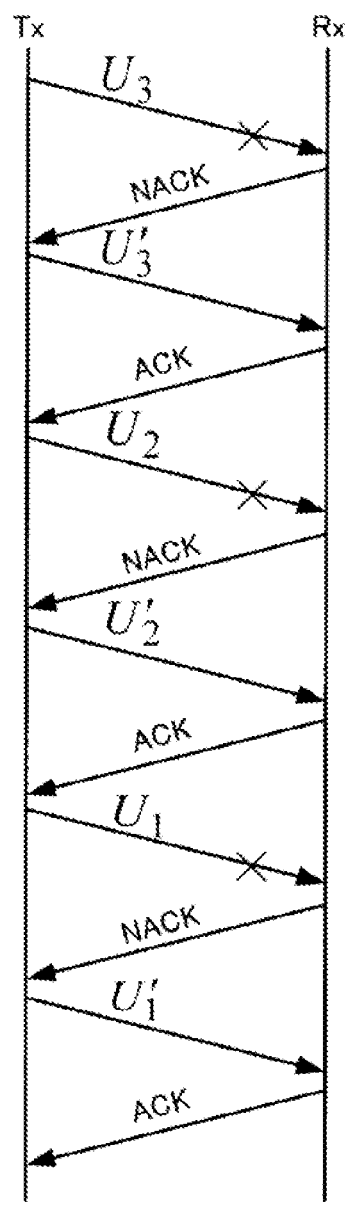
FIG. 9A and FIG. 9B are a diagram showing the comparison of the communication method between the type in the second embodiment of the present invention and the conventional type.
Figure 9B:
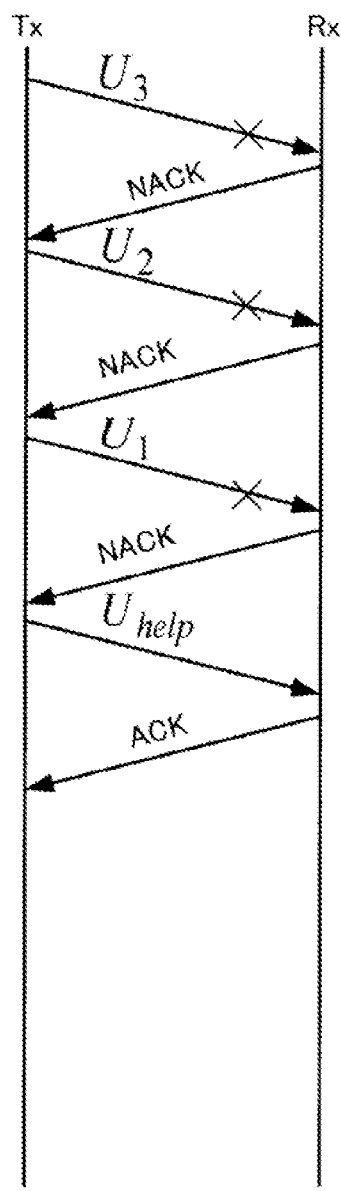

FIG. 9A and FIG. 9B show the comparison in the communication method between the system in the second embodiment and the conventional system. As shown in FIG. 9A and FIG. 9B, in the conventional communication system, retransmission packets $U'_1$, $U'_2$ and $U'_3$ are transmitted respectively for the transmission packets $U_1$, $U_2$ and $U_3$ that have become NACK, and therefore, packet transmission takes place six times. In contrast, in the communication system in the second embodiment, one helper packet $U_{help}$ can be transmitted for the three transmission packets $U_1$, $U_2$ and $U_3$, and therefore, packet transmission may be carried out only four times. Accordingly, in the communication system in the second embodiment, it is possible to increase the throughput by 3/2 times as compared to the conventional communication system. In addition, the present embodiment is described using the "Stop & Wait system" having the simplest operation as an example of an ARQ system for the purpose of simplicity; however, it is clear that the present invention can be applied to other ARQ systems.

Third Embodiment

Figure 10:
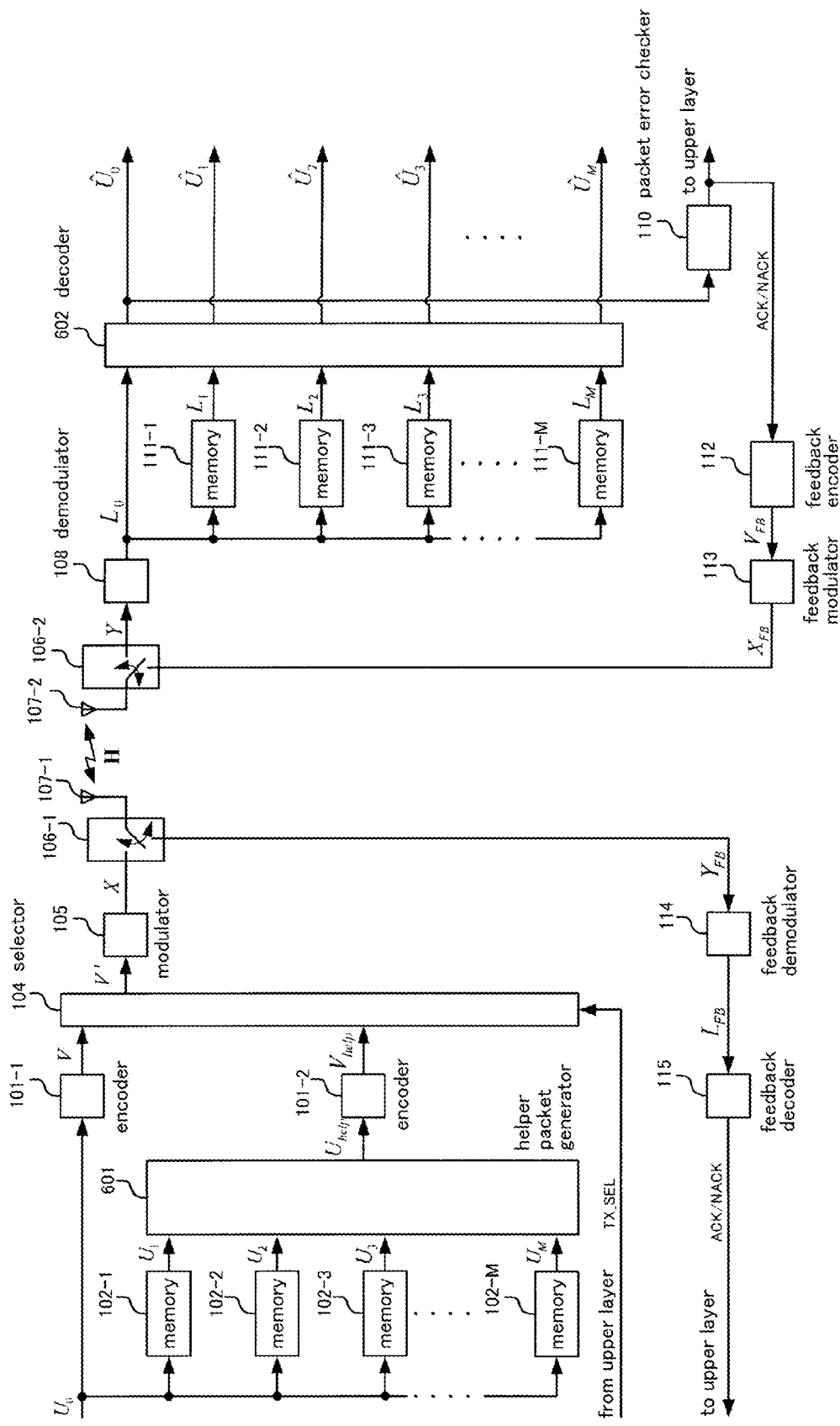
FIG. 10 is a functional block diagram showing the configuration of the wireless communication system according to the third embodiment of the present invention.

FIG. 10 shows a functional block diagram of the third embodiment of the present invention. The third embodiment has a configuration where there is one helper packet for M packets to be retransmitted (here, M is a natural number of 2 or greater). In the third embodiment, the number m of packets to be retransmitted is generalized. In the third embodiment, a helper packet is transmitted when the number of packets for which NACK has been returned becomes M. Here, the present embodiment is described using the "Stop & Wait system" as an example of an ARQ system for the purpose of simplicity.

The wireless communication on the transmission side in the third embodiment is provided with: encoding units 101-1 and 101-2; transmitted signal storage memories 102-1 through 102-m (=M); a helper packet generating unit 601; a transmitted signal selector 104; a modulator 105; a transmission/reception signal switcher 106-1; a transmission/reception antenna 107-1; a feedback demodulator 114; and a feedback decoder 115. The wireless communication device on the reception side in the third embodiment is provided with: a transmission/reception antenna 107-2; a transmission/reception signal switcher 106-2; a demodulator 108; a decoding unit 602; a packet error checker 110; demodulated signal storage memories 111-1 through 111-m (=M); a feedback encoder 112; and a feedback modulator 113.

The encoding units 101-1 and 101-2, the transmitted signal storage memories 102-1 through 102-m, the transmitted signal selector 104, the modulator 105, the transmission/reception signal switchers 106-1 and 106-2, the transmission/reception antennas 107-1 and 107-2, the demodulator 108, the packet error checker 110, the demodulated signal storage memories 111-1 through 111-m, the feedback encoder 112, the feedback modulator 113, the feedback demodulator 114 and the feedback decoder 115 are the same as those in the above embodiments, and therefore, the descriptions thereof are not repeated.

Figure 11:
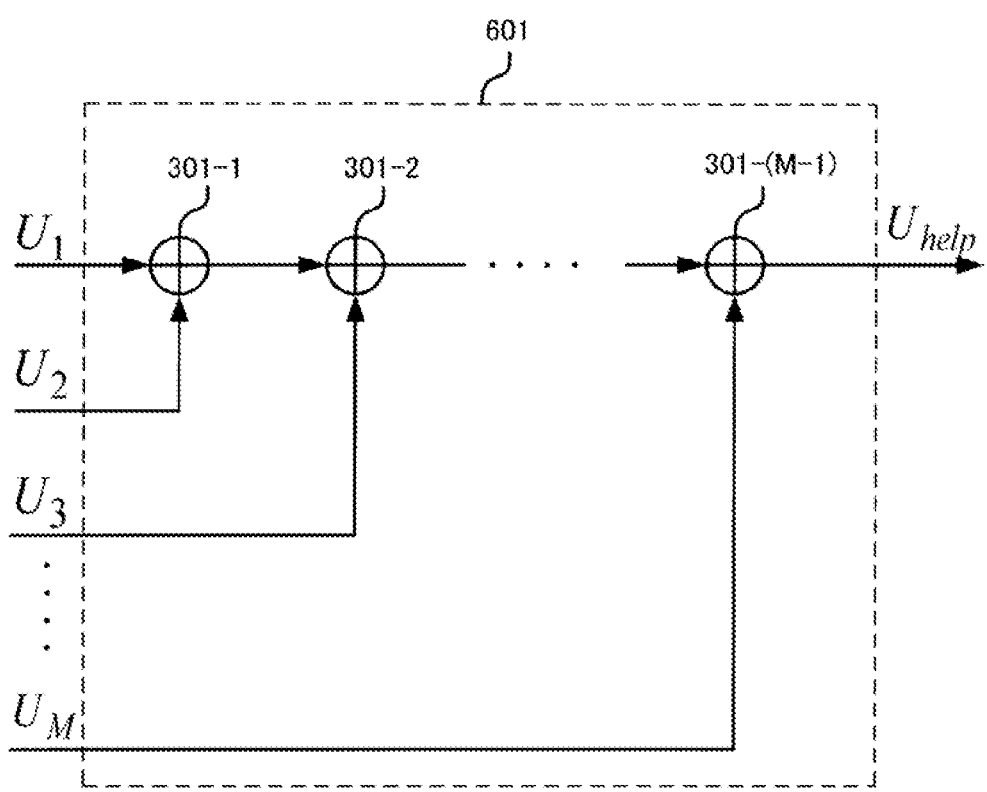
FIG. 11 is a functional block diagram showing the configuration of the helper packet generating unit in the third and fourth embodiments of the present invention.

FIG. 11 shows the configuration of the helper packet generating unit 601 in the third embodiment. In the third embodiment, the exclusive-or of the bit sequences $U_1$ through $U_M$ of the M transmission packets for which NACK has been returned is operated using M−1 exclusive-or operators 301-1 through 301-(M−1), and the results are outputted as a helper packet $V_{help}$.

Figure 12:
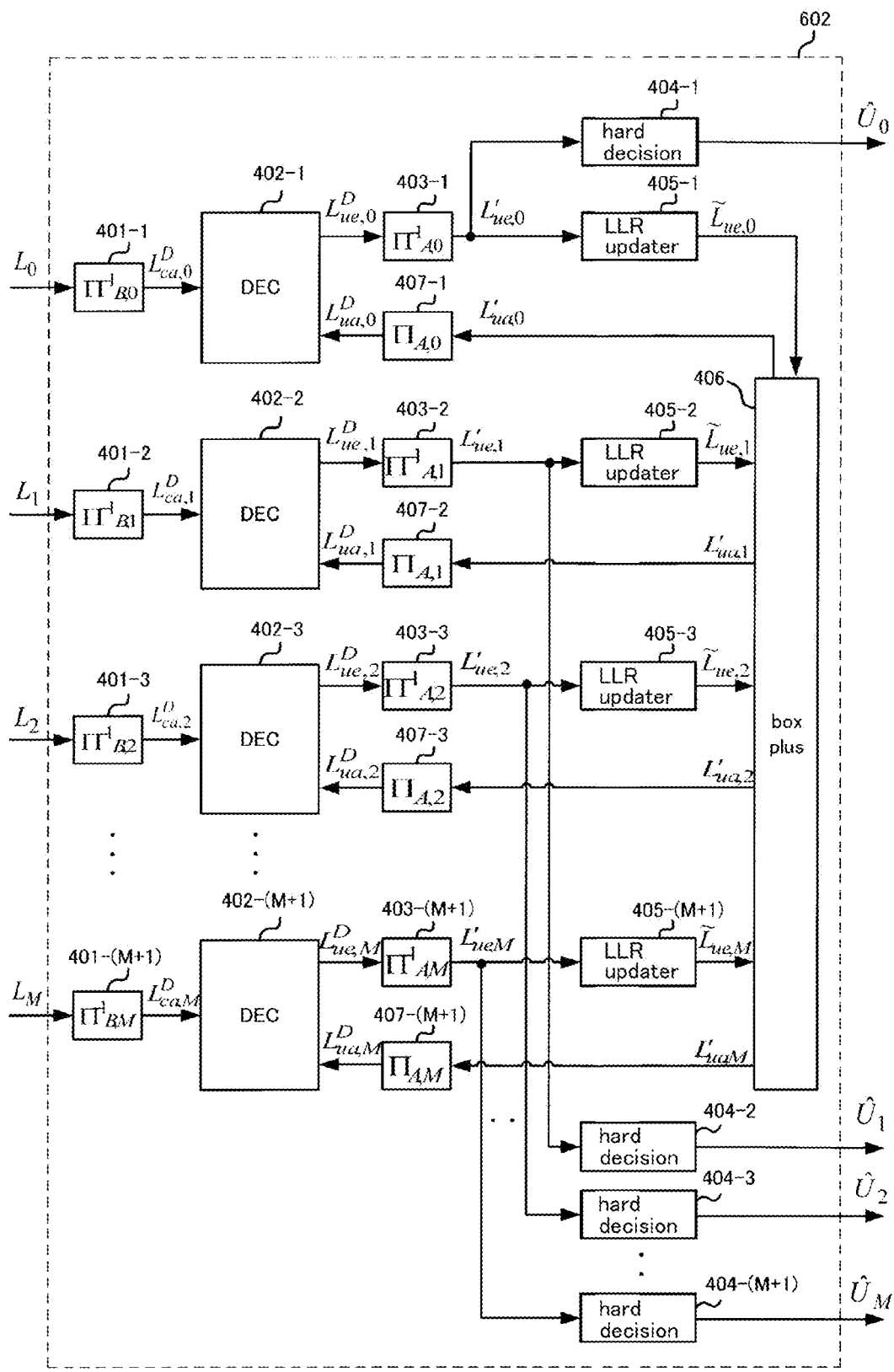
FIG. 12 is a functional block diagram showing the configuration of the decoding unit in the third embodiment of the present invention.

FIG. 12 shows the configuration of the decoding unit 602 in the third embodiment. The decoding unit 602 is provided with: an encoded bit region LLR deinterleaver 401-i; an error correction decoder 402-i; an information bit region LLR deinterleaver 403-i; a hard decision operator 404-i; an LLR updater A 405-i; a boxplus 406; and an information bit region LLR interleaver 407-i. Here, i=0 through m (here, m=M). The respective components are the same as those in the above embodiments, and therefore, the descriptions thereof are not repeated.

In the decoding unit 602 in the third embodiment, the decoding results of the M packet signals for which NACK has been returned and the decoding results of the packet signal of the helper packet are exchanged with each other so as to enhance the error correction performance.

As described above in the third embodiment, one helper packet is transmitted in response to the M packets for which NACK has been returned, and as a result, the throughput increases in the packets for which NACK has been returned as compared to the conventional system.

Figure 13A:
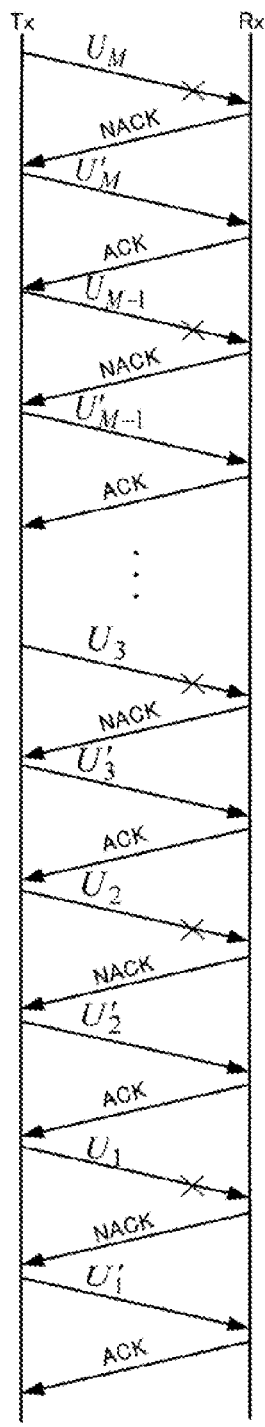
FIG. 13A and FIG. 13B are a diagram showing the comparison of the communication method between the type in the third or fourth embodiment of the present invention and the conventional type.
Figure 13B:
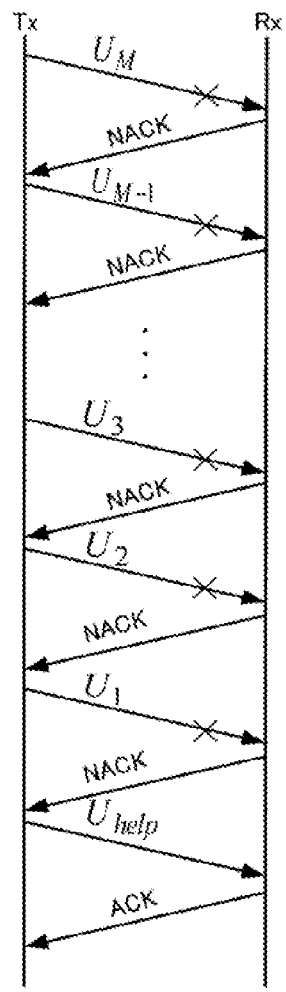

FIG. 13A and FIG. 13B show the comparison in the communication method between the system in the third embodiment and the conventional system. As shown in FIG. 13A and FIG. 13B, in the conventional communication system, retransmission packets $U'_1$ through $U'_M$ are transmitted respectively for the transmission packets $U_1$ through $U_M$ that have become NACK, and therefore, packet transmission takes place 2M times. In contrast, in the communication system in the third embodiment, one helper packet $U_{help}$ can be transmitted for the M transmission packets $U_1$ through $U_M$, and therefore, packet transmission may be carried out only M+1 times. Accordingly, in the communication system in the third embodiment, it is possible to increase the throughput by 2M/(M+1) times as compared to the conventional communication system. In addition, the present embodiment is described using the "Stop & Wait system" having the simplest operation as an example of an ARQ system for the purpose of simplicity; however, it is clear that the present invention can be applied to other ARQ systems.

Fourth Embodiment

Figure 14:
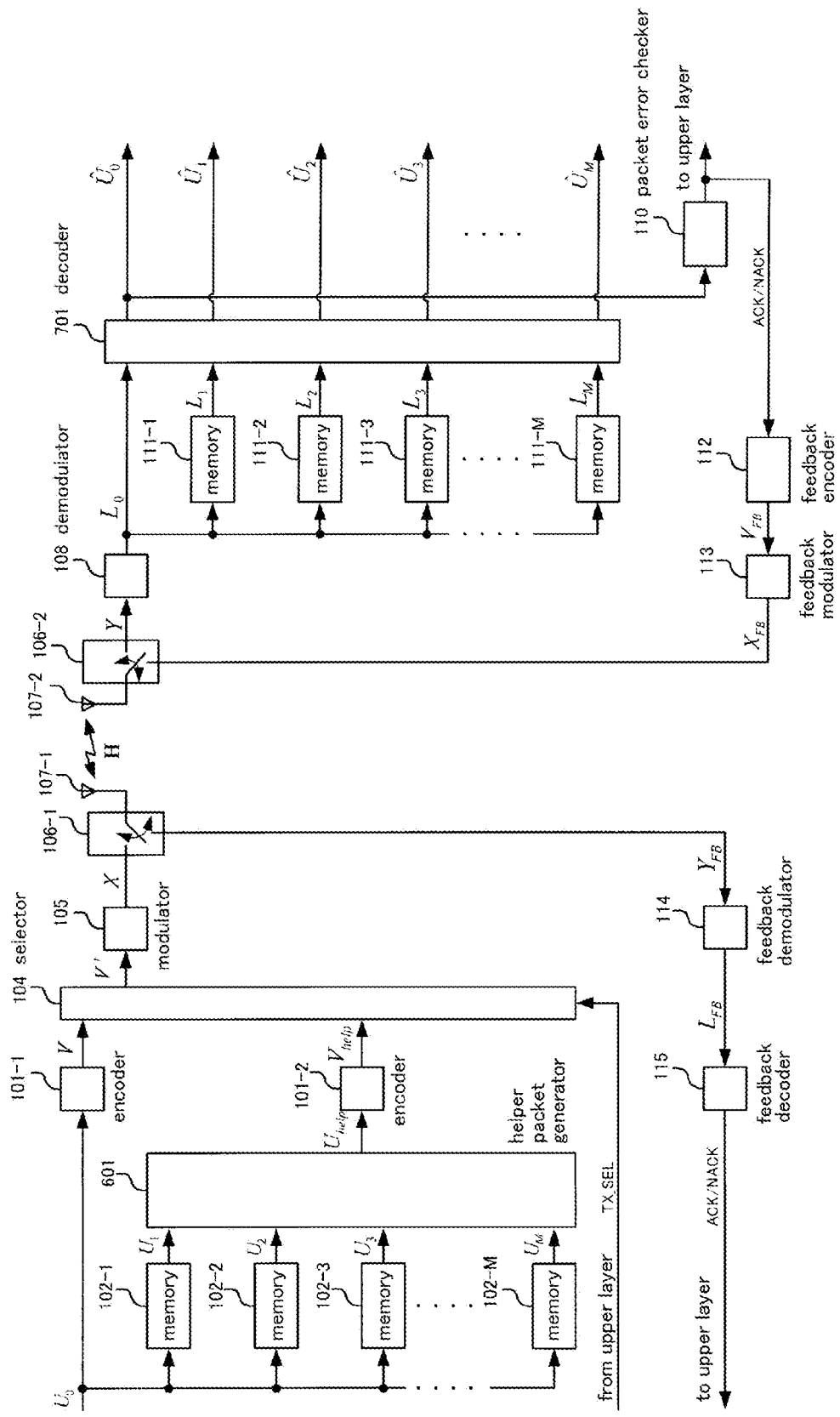
FIG. 14 is a functional block diagram showing the configuration of the wireless communication system according to the fourth embodiment of the present invention.

FIG. 14 shows the functional block diagram of the fourth embodiment of the present invention. The fourth embodiment has a configuration where there is one helper packet for M packets to be retransmitted (here, M is a natural number of two or greater) in the case where there is a correlation between the information resources of the respective packet signals (bit sequences to be transmitted). In the fourth embodiment, a helper packet is transmitted when the number of packets for which NACK has been returned becomes M. Here, the present embodiment is described using the "Stop & Wait system" as an example of an ARQ system for the purpose of simplicity.

The wireless communication on the transmission side in the fourth embodiment is provided with: encoding units 101-1 and 101-2; transmitted signal storage memories 102-1 through 102-m (=M); a helper packet generating unit 601; a transmitted signal selector 104; a modulator 105; a transmission/reception signal switcher 106-1; a transmission/reception antenna 107-1; a feedback demodulator 114; and a feedback decoder 115. The second wireless communication device on the reception side in the fourth embodiment is provided with: a transmission/reception antenna 107-2; a transmission/reception signal switcher 106-2; a demodulator 108; a decoding unit 701; a packet error checker 110; demodulated signal storage memories 111-1 through 111-m (=M); a feedback encoder 112; and a feedback modulator 113.

The encoding units 101-1 and 101-2, the transmitted signal storage memories 102-1 through 102-m, the transmitted signal selector 104, the modulator 105, the transmission/reception signal switchers 106-1 and 106-2, the transmission/reception antennas 107-1 and 107-2, the demodulator 108, the packet error checker 110, the demodulated signal storage memories 111-1 through 111-m, the feedback encoder 112, the feedback modulator 113, the feedback demodulator 114 and the feedback decoder 115 are the same as those in the above embodiments, and therefore, the descriptions thereof are not repeated. In addition, the helper packet generating unit 601 is the same as that in the third embodiment, and therefore, the description thereof is not repeated.

Figure 15:
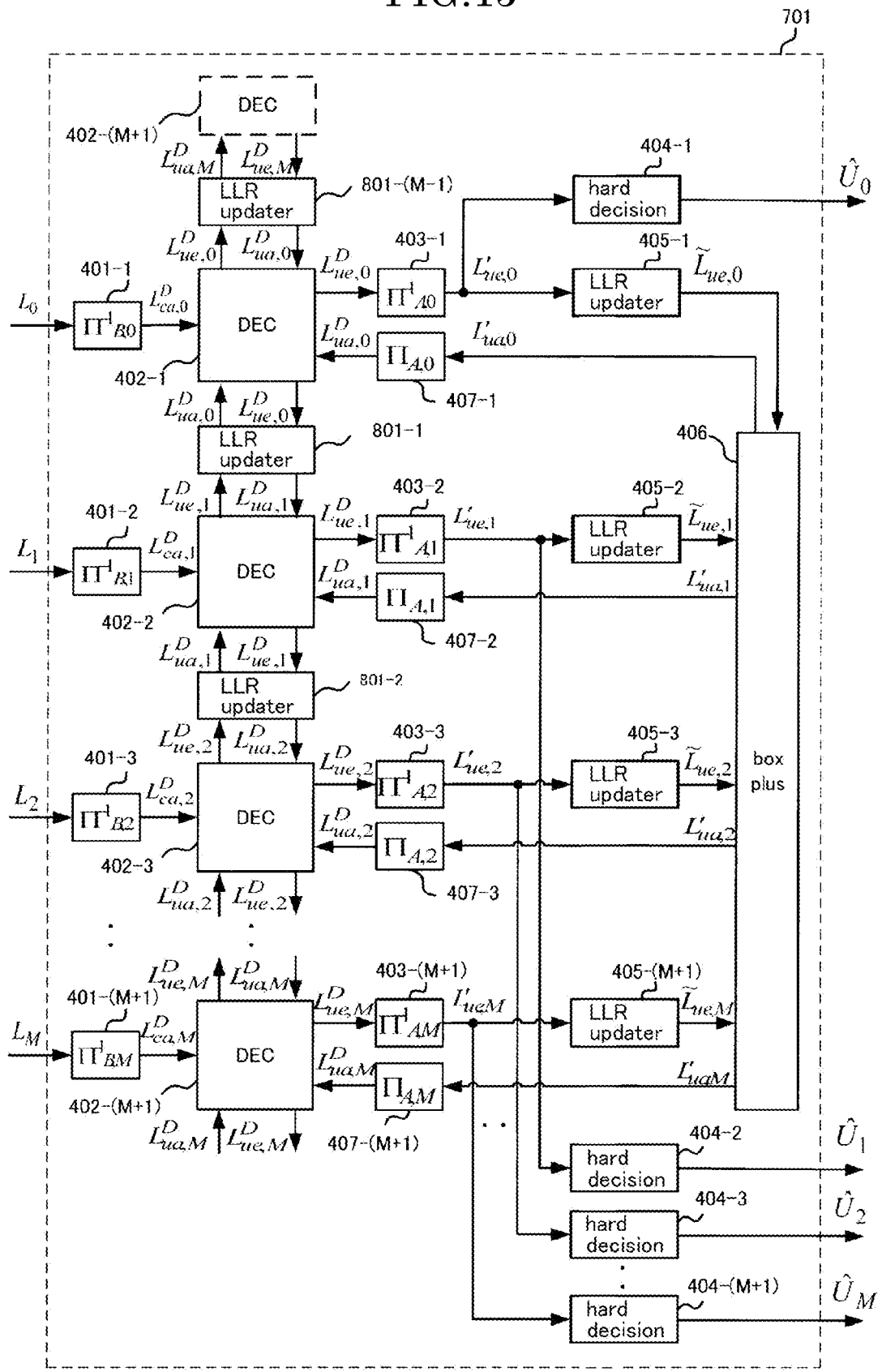
FIG. 15 is a functional block diagram showing the configuration of the decoding unit in the fourth embodiment of the present invention.

FIG. 15 shows the configuration of the decoding unit 701 in the fourth embodiment. The decoding unit 701 is provided with: an encoded bit region LLR deinterleaver 401-i; an error correction decoder 402-i; an information bit region LLR deinterleaver 403-i; a hard decision operator 404-i; an LLR updater A 405-i; a boxplus 406; an information bit region LLR interleaver 407-i; and an inter-decoders LLR updating unit 801-i. Here, i=0 through m (=M). The encoded bit region LLR deinterleaver 401-i, the error correction decoder 402-i, the information bit region LLR deinterleaver 403-i, the hard decision operator 404-i, the LLR updater A 405-i, the boxplus 406 and the information bit region LLR interleaver 407-i are the same as those in the above embodiments, and therefore, the descriptions thereof are not repeated.

Here, the error correction decoder 402-(M+1) drawn with a dotted line in FIG. 15 is the same as the error correction decoder 402-(M+1) drawn with a solid line, and is shown to be connected to the error correction decoder 402-1 through the inter-decoders LLR updating unit 801-(M−1) as an expression for the purpose of convenience.

Though FIG. 15 shows a ring type (chained together type) connection structure where the respective error correction decoders 402-i are connected in an annular form, a star type (all connection type) connection structure where the respective error correction decoders 402-i are connected in all combination may be used, for example, and thus, any type of connection may be used as long as all the error correction decoders 402-i are linked together.

Figure 16:
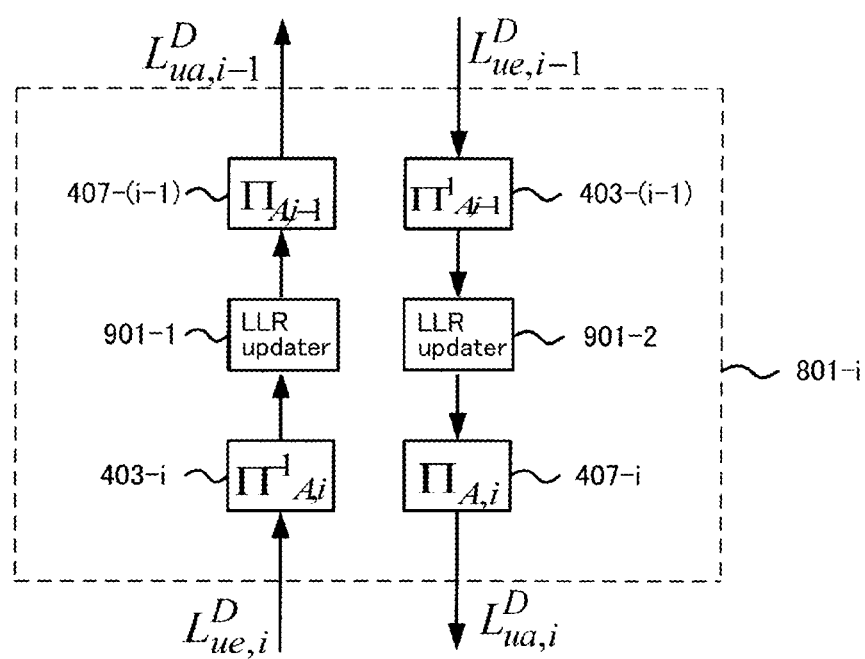
FIG. 16 is a functional block diagram showing the configuration of the inter-decoders LLR updating unit in the fourth embodiment of the present invention.

FIG. 16 shows the configuration of the inter-decoders LLR updating unit 801-i. The inter-decoders LLR updating unit 801-i is provided with: an information bit region LLR deinterleaver 403-i; an information bit region LLR interleaver 407-i; and LLR updaters B 901-1 and 901-2. The information bit region LLR deinterleaver 403-i and the information bit region LLR interleaver 407-i are the same as those in the above embodiments, and therefore, the descriptions thereof are not repeated.

The LLR updater B 901-1 updates the LLR that has been outputted from the information bit region LLR deinterleaver 403-i and outputs the results to the information bit region LLR interleaver 407-(i-1). The LLR updater B 901-2 updates the LLR that has been outputted from the information bit region LLR deinterleaver 403-(i-1) and outputs the results to the information bit region LLR interleaver 407-i.

The LLR updaters B 901-1 and 901-2 use the inputted LLR so as to update the LLR in accordance with the following formula.

[Formula 7]

$$L_{out} = \ln\frac{(1-\hat{p}_{ij})\cdot\exp(L_{in})+\hat{p}_{ij}}{(1-\hat{p}_{ij})+\exp(L_{in})\cdot\hat{p}_{ij}} \quad (7)$$

Here, $\hat{p}_{ij}$ is the probability of becoming 1 when the exclusive-or of the information bits between the decoders is operated. $\hat{p}_{ij}$ is calculated in the following formula, for example, when the LLR that are inputted from the respective decoders are $L_i$ and $L_j$, and the respective hard decision values are $\hat{u}_i$ and $\hat{u}_j$.

[Formula 8]

$$\hat{p}_{ij} = P_r(\hat{u}_i \oplus \hat{u}_j) \quad (8)$$

Here, $P_r(x)$ is the probability of x becoming 1.

As described above, it is possible to exchange LLRs between decoders because the fact that there is correlation between the information sources (bit sequences to be transmitted) of the respective packet signals is utilized.

As described above in the fourth embodiment, the throughput increases by 2M/(M+1) in the same manner as shown in the third embodiment, and at the same time, it becomes possible to increase the reception characteristics by updating the LLRs between the decoders through the use of correlation between the information sources. In addition, the present embodiment is described by using the "Stop & Wait system" having the simplest operation as an example of an ARQ system for the purpose of simplicity; however, it is clear that the present invention can be applied to other ARQ systems.

As described above, in the wireless communication systems according to the respective embodiments, in general, the wireless communication device on the transmission side transmits a packet signal that has been generated by encoding the bit series that is to be transmitted, and the reception device on the reception side sends back ACK to indicate that the packet signal has been received normally or sends back NACK to indicate that the packet signal could not be received normally.

The wireless communication device on the transmission side operates as follows. That is to say, the transmitted signal storage memories (102-1 through 102-M) store bit sequences concerning the packet signals for which NACK has been returned. The exclusive-or operators (301-1 through 301-(M−1)) operate the exclusive-or of the bit sequences concerning a predetermined number, which is two or greater, of packet signals that are stored in the transmitted signal storage memories. The encoding unit (101-2) through the transmission/reception antenna (107-1) transmit an auxiliary packet signal that has been generated by encoding the bit sequence of the helper packet resulting from the operation by the exclusive-or operator in the case where the number of packet signals for which NACK has been returned has reached a predetermined number.

Concretely, the encoding unit carries out the following process. That is to say, the information bit region LLR interleaver (201) carries out a process for realigning the bit sequence resulting from the operation by the exclusive-or operator in a predetermined order. The encoder (202) carries out an error correction encoding process on the bit sequence after the realigning process. The encoded bit region LLR interleaver (203) carries out a process for realigning the bit sequence after the error correction encoding in a predetermined order.

The wireless communication device on the reception side operates as follows. That is to say, the demodulator (108) calculates the likelihood information (LLR sequence in the present embodiment) of the received packet signal. The demodulated signal storage memories (111-1 through 111-M) store the likelihood information of the packet signals for which NACK has been returned. In the case where the packet signal of a helper packet has been received, the decoding unit (602) decodes the packet signal of the helper packet and a predetermined number of packet signals for which NACK has been returned on the basis of the likelihood information of the packet signal of the helper packet and the likelihood information of the predetermined number of packet signals stored in the demodulated signal storage memories.

Concretely, the following process is carried out in the decoding unit. That is to say, the encoded bit region LLR deinterleavers (401-1 through 401-(M+1)) carry out a process for returning to its original order the order of the respective pieces of likelihood information that corresponds to the order in which the respective pieces of likelihood information of the packet signal of the helper packet and the predetermined number of packet signals for which NACK has been returned have been realigned by the encoded bit region bit interleaver (203) within the encoding unit on the transmission side. The error correction decoders (402-1 through 402-(M+1)) carry out the error correction decoding process that corresponds to the error correction encoding process by the encoder (202) within the encoding unit on the transmission side on the respective pieces of likelihood information after the order of alignment has been returned. The information bit region LLR deinterleavers (403-1 through 403-(M+1)) carry out a process for returning to its original order the order of the respective pieces of likelihood information that corresponds to the order of the realignment by the information bit region bit interleaver (201) within the encoding unit on the transmission side on the respective pieces of likelihood information after the error correction decoding. The LLR updating units A (405-1 through 405-(M+1)) update the respective pieces of likelihood information after the order of alignment has been returned on the basis of the mutual information of the packet signals that corresponds to the likelihood information. The updating on the basis of the mutual information is carried out using an estimation value of the bit error ratio in accordance with the mutual information, for example. The boxplus (406) carries out a boxplus operation, which is an operation that corresponds to the exclusive-or by the helper packet generating unit on the transmission side on the respective pieces of likelihood information after being updated. The information bit region LLR interleavers (407-1 through 407-(M+1)) carry out a process for realigning the respective pieces of likelihood information after the boxplus operation in the same order as the order of realignment by the information bit region LLR interleaver (201) within the encoding unit on the transmission side. The respective pieces of likelihood information after the realignment are fed back to the error correction decoder that corresponds to the likelihood information so as to be reflected in the contents of the process by the error correction decoder.

As described above, the configuration where one helper packet is transmitted on the basis of exclusive-or of the M packets for which NACK has been returned instead of these packets is provided in order to achieve an increase in the throughput by 2M/(M+1) as compared to the conventional communication system. In addition, likelihood information is exchanged between the decoder of the helper packet and the respective decoders of the packets for which NACK has been returned through the boxplus, and thus, an increase in the error correction performance is achieved.

Furthermore, in the wireless communication system according to the fourth embodiment, the decoding unit (701) of the wireless communication device on the reception side operates as follows in the case where the wireless communication device on the transmission side transmits a plurality of packet signals that has been generated by encoding a plurality of bit sequences that correlate. That is to say, between error correction decoders, the inter-decoders LLR updating unit (801-1 through 801-(M+1)) updates the likelihood information after decoding by one error correction decoder on the basis of the likelihood information after the decoding process by another error correction decoder so that the likelihood information after being updated is reflected in the decoding process by another error correction decoder.

Concretely, the following process is carried out in the inter-decoders LLR updating unit. That is to say, the information bit region LLR deinterleavers (403-1 through 403-(M+1)) carries out a process for returning to its original order the order of the respective pieces of likelihood information that corresponds to the order realigned by the information bit region bit interleaver (201) within the encoding unit on the transmission side on the likelihood information after being processed by a one error correction decoder (hereinafter, referred to as first likelihood information). The information bit region LLR deinterleavers carry out a process for returning to its original order on the likelihood information after being processed by another error correction decoder (hereinafter, referred to as second likelihood information) in the same manner. The LLR updating units B (901-1 and 901-2) update the first likelihood information after the alignment order has been returned on the basis of the second likelihood information after the alignment order has been returned. The LLR updating units B update the second likelihood information after the alignment order has been returned on the basis of the first likelihood information after the alignment order has been returned in the same manner. The information bit region LLR interleavers (407-1 through 407-(M+1)) carry out a process for realigning the first likelihood information after being updated in the same order as the order realigned by the information bit region LLR interleaver (201) within the encoding unit on the transmission side. The information bit region LLR interleavers carry out a process for realignment on the second likelihood information after being updated in the same manner. The first likelihood information after being realigned is outputted to another error correction decoder and reflected in the contents of the process of this error correction decoder. In addition, the second likelihood information after being realigned is outputted to the one error correction decoder and reflected in the contents of the process of this error correction decoder.

As described above, in the case where the information resources (bit sequences to be transmitted) of the respective packet signals have correlation, a configuration that allows error correction decoders to directly exchange likelihood information without having a boxplus in-between can be added. As a result, it becomes possible to increase the reception characteristics.

As for the structure for connecting error correction decoders through an inter-decoder LLR updating unit, various connection structures such as a ring type (chained together type) where the respective error correction decoders are connected in annular form, and a star type (any combination type) where the respective error correction decoders are connected in all combination can be used.

Here, the configurations of the system, the device and the like according to the present invention are not necessarily limited to those described in the above, and various configuration may be used. In addition, it is possible to provide the present invention as method or a system for implementing the process according to the present invention, a program for implementing such a method or system, or a recording medium for recording such a program.

INDUSTRIAL APPLICABILITY

The present invention can be applied to various types of wireless communication systems for retransmitting/receiving packet signals.

REFERENCE SIGNS LIST

101-1, 102-2 . . . encoding unit
102-1 through 102-M . . . transmitted signal storage memory
103 . . . helper packet generating unit in the first embodiment
104 . . . transmitted signal selector
105 . . . modulator
106-1, 106-2 . . . transmission/reception signal switch
107-1, 107-2 . . . transmission/reception antenna
108 . . . demodulator
109 . . . decoding unit in the first embodiment
110 . . . packet error checker
111-1 through 111-M . . . demodulated signal storage memory
112 . . . feedback encoder
113 . . . feedback modulator
114 . . . feedback demodulator
115 . . . feedback decoder
201 . . . information bit region bit interleaver
202 . . . encoder
203 . . . encoded bit region bit interleaver
301-1 through 301-(M−1) . . . exclusive-or operator
401-1 through 401-(M+1) . . . encoded bit region LLR deinterleaver
402-1 through 402-(M+1) . . . error correction decoder
403-1 through 403-(M+1) . . . information bit region LLR deinterleaver
404-1 through 404-(M+1) . . . hard decision operator
405-1 through 405-(M+1) . . . LLR updater A
406 . . . boxplus
407-1 through 407-(M+1) . . . information bit region LLR interleaver
501 . . . helper packet generating unit in the second embodiment
502 . . . decoding unit in the second embodiment
601 . . . helper packet generating unit in the third and fourth embodiments
602 . . . decoding unit in the third embodiment
701 . . . decoding unit in the fourth embodiment
801-1 through 801-(M+1) . . . inter-decoders LLR updating unit
901-1, 901-2 . . . LLR updating unit B

The invention claimed is:

1. A wireless communication system, comprising a wireless communication device on a transmission side that transmits a packet signal generated by encoding a bit sequence to be transmitted, and a wireless communication device on a reception side that sends back an ACKnowledgement (ACK) indicating that the packet signal has been received normally or a Negative ACKnowledgement (NACK) indicating that the packet signal could not be received normally, wherein said wireless communication device on the transmission side performs:

storing in a first memory the bit sequence concerning the packet signal for which NACK has been sent back;

operating exclusive-or on the bit sequences concerning a predetermined number, which is two or greater, of the packet signals stored in the first memory; and transmitting an auxiliary packet signal generated by encoding a bit sequence resulting from the exclusive-or operation in a case where a number of packet signals for which NACK has been sent back has reached the predetermined number, and wherein said wireless communication device on the reception side performs:

calculating a likelihood information on a received packet signal;

storing in a second memory the likelihood information on the received packet signal for which NACK has been sent back; and decoding the auxiliary packet signal and the predetermined number of packet signals for which NACK has been sent back on a basis of the likelihood information on the auxiliary packet signal and the likelihood information on the predetermined number of packet signals stored in the second memory in a case where the auxiliary packet signal has been received, and wherein in said decoding, said wireless communication device on the reception side carries out a decoding process that corresponds to the encoding on each piece of the likelihood information on the auxiliary packet signal and the predetermined number of packet signals for which NACK has been sent back, updates each piece of the likelihood information after the decoding process on a basis of a mutual information of the corresponding packet signals, carries out an operation that corresponds to the exclusive-or operation on each piece of the likelihood information after being updated, and reflects each piece of the likelihood information resulting from the operation in the decoding process concerning the corresponding packet signals.

2. The wireless communication system according to claim 1,
wherein said wireless communication device on the transmission side transmits a plurality of packet signals generated by encoding a plurality of bit sequences having correlations, and
wherein said wireless communication device on the reception side has three or more decoders for carrying out the decoding process that corresponds to the encoding on each piece of the likelihood information on the auxiliary packet signal and the predetermined number of packet signals for which NACK has been sent back,
wherein in said decoding, updates the likelihood information after the decoding process by one decoder from among the decoders on a basis of the likelihood information after the decoding process by another decoder, and reflects the likelihood information after being updated in the decoding process by said another decoder.

3. The wireless communication system according to claim 2,
wherein said wireless communication device on the reception side has a structure where the decoders are connected in annular form or a structure where the decoders are connected in all combination,
wherein in said decoding, updates the likelihood information after the decoding process by one decoder from among the decoders that are connected in either structure on a basis of the likelihood information after the decoding process by another decoder, and reflects the likelihood information after being updated in the decoding process by said another decoder.

4. A wireless communication device on a reception side for sending back, to a wireless communication device on a transmission side that transmitted a packet signal generated by encoding a bit sequence to be transmitted, an ACKnowledgement (ACK) indicating that the packet signal has been received normally or a Negative ACKnowledgement (NACK) indicating that the packet signal could not be received normally in response to the reception of the packet signal,
wherein said wireless communication device on the transmission side operates exclusive-or on the bit sequence concerning the packet signals for which NACK has been sent back in a case where a number of these packet signals has reached a predetermined number, which is two or greater, and transmits an auxiliary packet signal generated by encoding the bit sequence resulting from the exclusive-or operation,
wherein said wireless communication device on the reception side performs:
calculating a likelihood information on a received packet signal;
storing in a memory the likelihood information on the packet signal for which NACK has been sent back; and
decoding the auxiliary packet signal and the predetermined number of packet signals for which NACK has been sent back on a basis of the likelihood information on the auxiliary packet signal and the likelihood information on the predetermined number of packet signals stored in the memory in a case where the auxiliary packet signal has been received, and
wherein in said decoding, said wireless communication device on the reception side carries out a decoding process that corresponds to the encoding on each piece of the likelihood information on the auxiliary packet signal and the predetermined number of packet signals for which NACK has been sent back, updates each piece of the likelihood information after the decoding process on a basis of a mutual information of the corresponding packet signals, carries out an operation that corresponds to the exclusive-or operation on each piece of the likelihood information after being updated, and reflects each piece of the likelihood information resulting from the operation in the decoding process concerning the corresponding packet signals.

5. A wireless communication method according to which a wireless communication device on a reception side that has received a packet signal generated by encoding a bit sequence to be transmitted sends back, to a wireless communication device on a transmission side that transmitted the packet signal, an ACKnowledgement (ACK) indicating that the packet signal has been received normally or a Negative ACKnowledgement (NACK) indicating that the packet signal could not be received normally,
wherein said wireless communication device on the transmission side operates exclusive-or on the bit sequence concerning the packet signals for which NACK has been sent back in a case where a number of these packet signals has reached a predetermined number, which is two or greater, and transmits an auxiliary packet signal generated by encoding the bit sequence resulting from the exclusive-or operation,
wherein said wireless communication device on the reception side performs:
calculating a likelihood information on the received packet signal;
storing in a memory the likelihood information on the packet signal for which NACK has been sent back; and
decoding the auxiliary packet signal and the predetermined number of packet signals for which NACK has been sent back on a basis of the likelihood information on the auxiliary packet signal and the likelihood information on the predetermined number of packet signals for which NACK has been sent back in a case where the auxiliary packet signal has been received,
wherein in said decoding, said wireless communication device on the reception side carries out a decoding process that corresponds to the encoding on each piece of the likelihood information on the auxiliary packet signal and the predetermined number of packet signals for which NACK has been sent back, updates each piece of the likelihood information after the decoding process on a basis of a mutual information of the corresponding packet signals, carries out an operation that corresponds to the exclusive-or operation on each piece of the likelihood information after being updated, and reflects each piece of the likelihood information resulting from the operation in the decoding process concerning the corresponding packet signals.

\* \* \* \* \*